United States Patent
Suzuki et al.

(10) Patent No.: US 9,443,617 B2
(45) Date of Patent: Sep. 13, 2016

(54) MEMORY SYSTEM AND METHOD OF CONTROLLING MEMORY SYSTEM

(71) Applicant: Kabushiki Kaisha Toshiba, Minato-ku, Tokyo (JP)

(72) Inventors: Kenichiro Suzuki, Yokohama Kanagawa (JP); Katsuhiko Ueki, Katsushika Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 3 days.

(21) Appl. No.: 14/485,169

(22) Filed: Sep. 12, 2014

(65) Prior Publication Data

US 2016/0019982 A1 Jan. 21, 2016

Related U.S. Application Data

(60) Provisional application No. 62/026,478, filed on Jul. 18, 2014.

(51) Int. Cl.
| | | |
|---|---|---|
| *G11C 16/06* | (2006.01) | |
| *G11C 29/52* | (2006.01) | |
| *G11C 29/42* | (2006.01) | |
| *G11C 29/44* | (2006.01) | |
| G11C 16/04 | (2006.01) | |
| G11C 29/04 | (2006.01) | |

(52) U.S. Cl.
CPC ............ *G11C 29/52* (2013.01); *G11C 29/42* (2013.01); *G11C 29/44* (2013.01); *G11C 16/0483* (2013.01); *G11C 2029/0409* (2013.01)

(58) Field of Classification Search
CPC ............................... G11C 29/52; G11C 16/06
USPC ............ 365/185.09, 185.17, 185.19, 230.03
See application file for complete search history.

(56) References Cited

U.S. PATENT DOCUMENTS

| | | | |
|---|---|---|---|
| 8,068,365 B2 | 11/2011 | Kim | |
| 2010/0058003 A1* | 3/2010 | Goto | ........................ G11C 7/10 |
| | | | 711/154 |
| 2011/0040926 A1* | 2/2011 | Frost | ................... G06F 11/1044 |
| | | | 711/103 |
| 2012/0254519 A1 | 10/2012 | Ellis | |
| 2013/0024605 A1 | 1/2013 | Sharon et al. | |

FOREIGN PATENT DOCUMENTS

| | | |
|---|---|---|
| JP | 2010-176702 A | 12/2010 |
| JP | 2011-511391 A | 4/2011 |
| JP | 5360214 B2 | 1/2012 |
| JP | 5221593 B2 | 6/2013 |
| JP | 5360214 B2 | 12/2013 |
| WO | 2009/097677 A1 | 8/2009 |
| WO | 2010/027983 A1 | 3/2010 |

\* cited by examiner

*Primary Examiner* — Tha-O H Bui
(74) *Attorney, Agent, or Firm* — White & Case LLP

(57) ABSTRACT

According to one embodiment, a controller includes a quality measuring unit, a block classifying unit, and a multi-plane setting unit. The quality measuring unit measures quality of a block. The block classifying unit classifies the block for every plane based on a measurement result of the quality. The multi-plane setting unit selects one block belonging to the same classification from each plane and combines the blocks to generate the multi-plane.

20 Claims, 17 Drawing Sheets

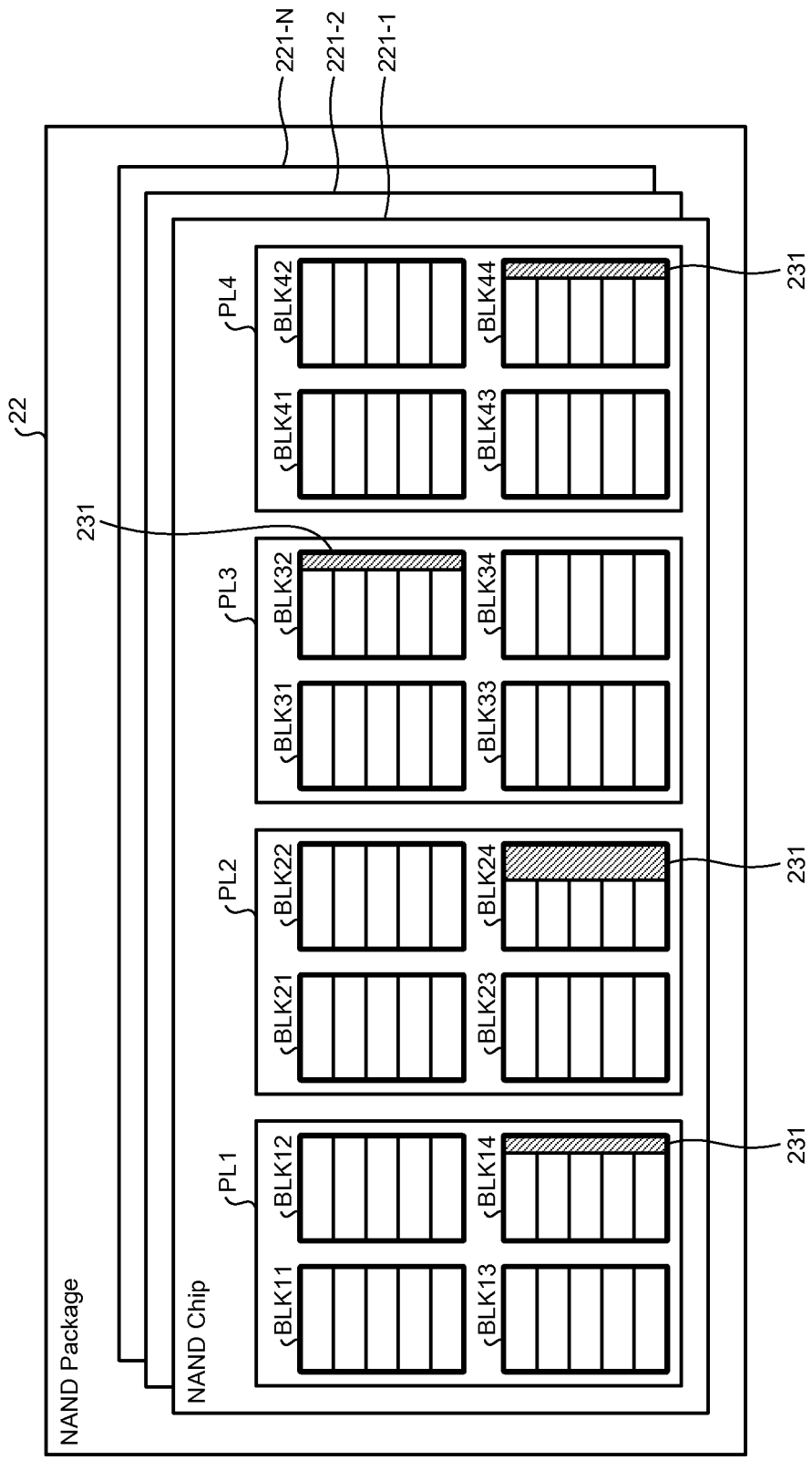

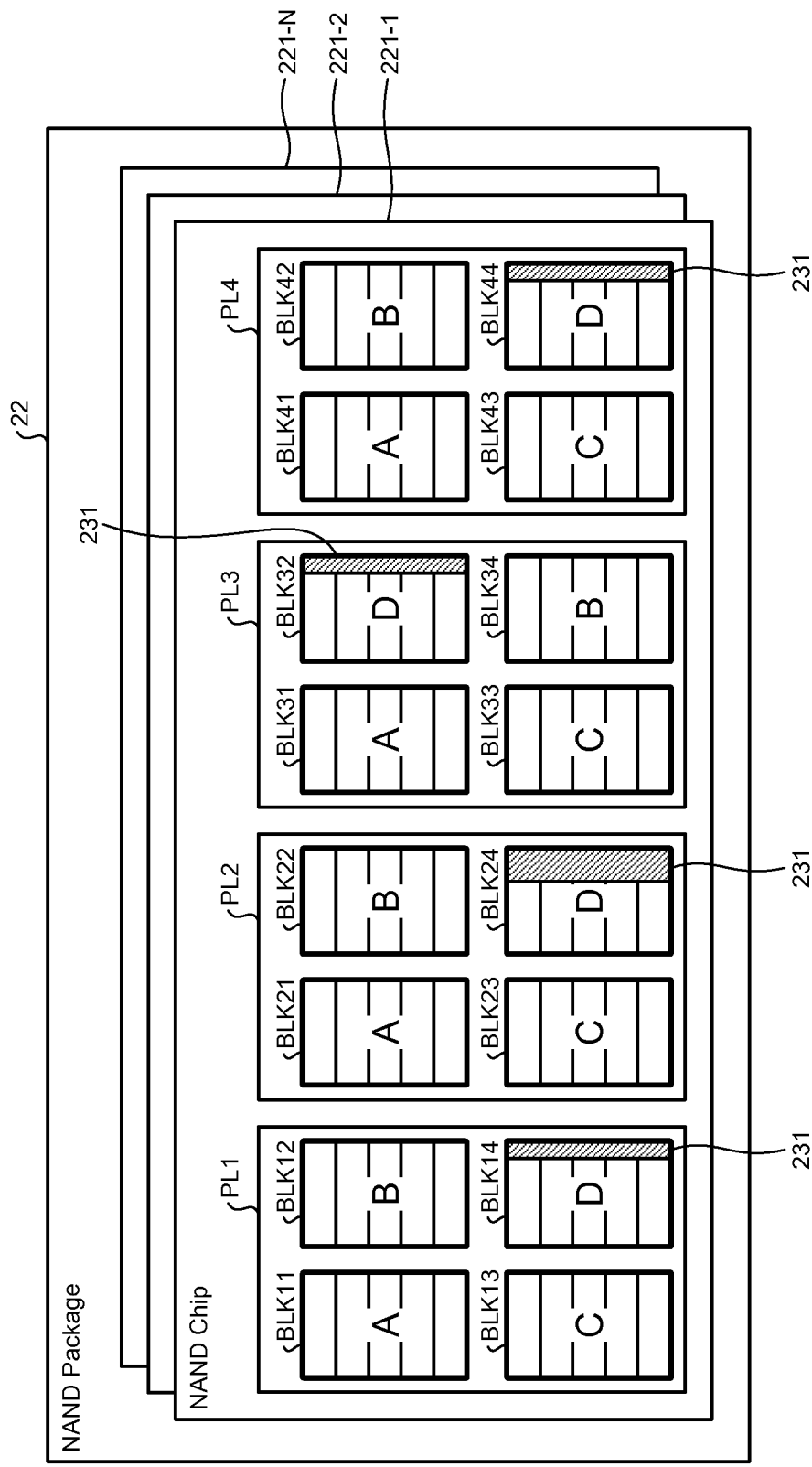

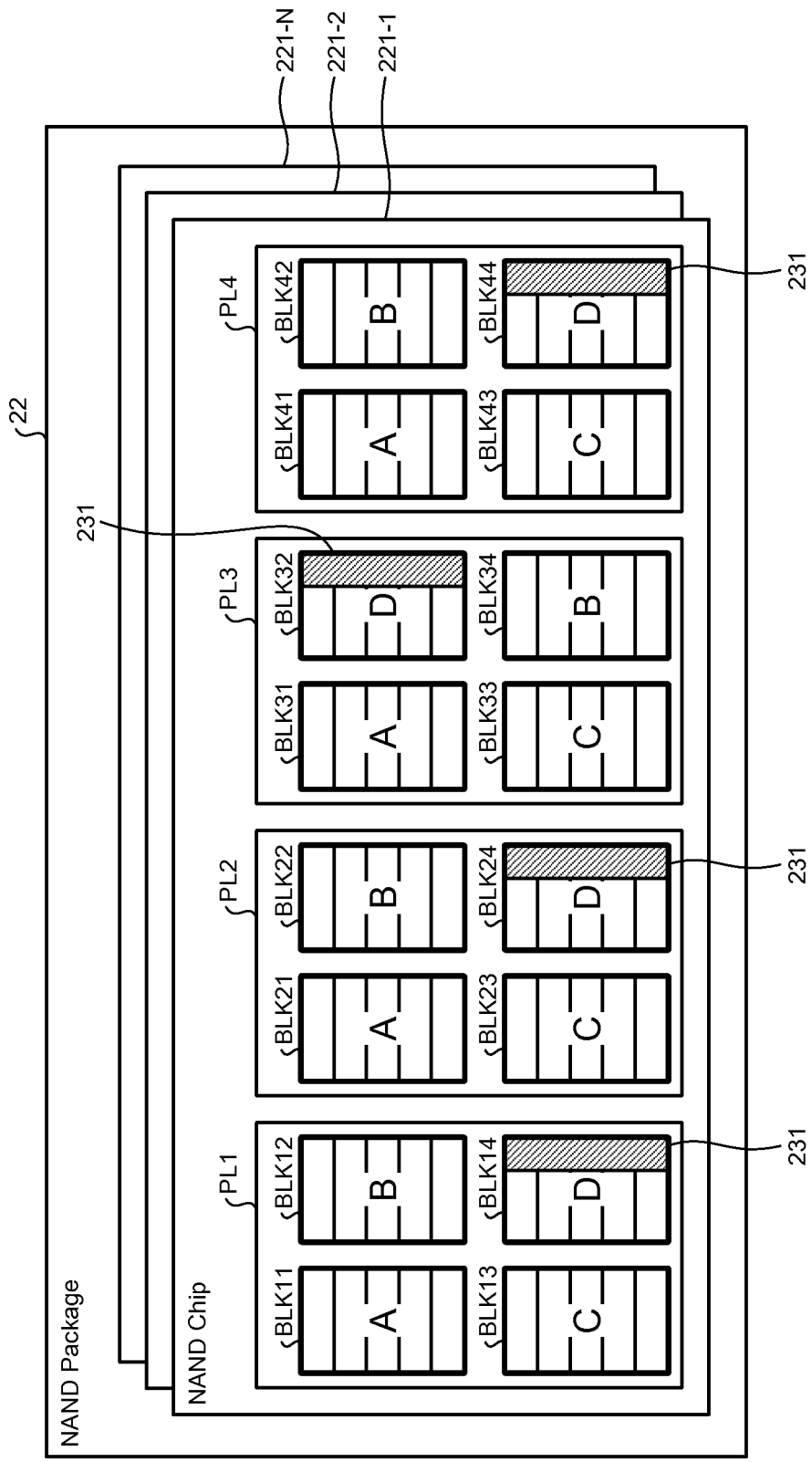

FIG.10

| GROUP \ PLANE | PLANE PL1 | PLANE PL2 | PLANE PL3 | PLANE PL4 |
|---|---|---|---|---|
| FIRST GROUP | BLK11, BLK12, BLK19, ... | BLK22, BLK26, ... | BLK31, BLK33, BLK310, ... | BLK41, BLK46, ... |
| SECOND GROUP | BLK13, BLK15, BLK17, ... | BLK21, BLK27, BLK28, BLK29, BLK210, ... | BLK32, BLK36, BLK39, ... | BLK42, BLK43, BLK45, BLK410, ... |
| THIRD GROUP | BLK14, BLK18, BLK110, ... | BLK24, BLK25, ... | BLK34, BLK35, BLK38, ... | BLK44, BLK47, BLK49, ... |
| FOURTH GROUP | BLK16, ... | BLK23, ... | BLK37, ... | BLK48, ... |

| MULTI-PLANE | BLOCK |
|---|---|
| MULTI-PLANE A | BLK11, BLK22, BLK31, BLK41 |
| MULTI-PLANE B | BLK12, BLK26, BLK33, BLK46 |
| ⋮ | ⋮ |
| MULTI-PLANE C | BLK13, BLK21, BLK32, BLK42 |
| ⋮ | ⋮ |
| MULTI-PLANE D | BLK14, BLK24, BLK34, BLK44 |
| ⋮ | ⋮ |
| MULTI-PLANE E | BLK16, BLK23, BLK37, BLK48 |
| ⋮ | ⋮ |

FIG.13

| QUALITY / NUMBER OF REWRITES | 1 | 2 | 3 | 4 |
|---|---|---|---|---|
| TO $10^3$ | 1 | 2 | 3 | 4 |
| $10^3$ TO $10^4$ | 1 | 2 | 3 | 4 |
| $10^4$ TO $10^5$ | 2 | 3 | 3 | 4 |
| $10^5$ TO | 3 | 3 | 4 | 4 |

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Application No. 62/026,478, filed on Jul. 18, 2014; the entire contents of which are incorporated herein by reference.

FIELD

Embodiments described herein relate generally to a memory system and a method of controlling the memory system.

BACKGROUND

In a memory system that uses NAND type flash memory for a storage medium, data is stored with an ECC (Error Correction Code/Error Checking and Correction) of a predetermined length to be used for error correction added to the data of a predetermined length. However, consideration is not conventionally taken on a case in which degradation in a bit error rate (hereinafter referred to as BER) of a block, which is a unit of erase, is found.

BRIEF DESCRIPTION OF THE DRAWINGS

FIGS. 5A to 5D are views schematically illustrating one example of a procedure of the multi-plane setting process according to the first embodiment;

FIG. 10 is a view illustrating one example of classification of blocks for every plane according to the third embodiment;

FIG. 13 is a view illustrating one example of ranking of groups according to a fifth embodiment.

DETAILED DESCRIPTION

In general, according to one embodiment, a memory system including a nonvolatile memory and a controller is provided. The nonvolatile memory includes a plurality of planes, each of which includes a plurality of blocks. The controller simultaneously accesses the blocks configuring the multi-plane. The multi-plane is a set of the block selected from each of the plurality of planes. The controller includes a quality measuring unit, a block classifying unit, and a multi-plane setting unit. The quality measuring unit measures the quality of the block. The block classifying unit classifies the blocks for every plane based on a measurement result of the quality. The multi-plane setting unit selects one block belonging to the same classification from each of the planes, and combines the blocks to form the multi-plane.

Exemplary embodiments of the memory system and the method of controlling the memory system will be explained below in detail with reference to the accompanying drawings. The present invention is not limited to the following embodiments.

In the embodiments described below, when degradation of the BER of the block is found in the memory system that uses the NAND type flash memory for the storage medium, a method of assigning a part of a user data region to an ECC region to strengthen the protection of data is used. That is, a newly assigned ECC storage region is added to the ECC storage region of a predetermined length to set the updated ECC storage region. The reliability of the data can be thereby ensured.

Figure 1A:
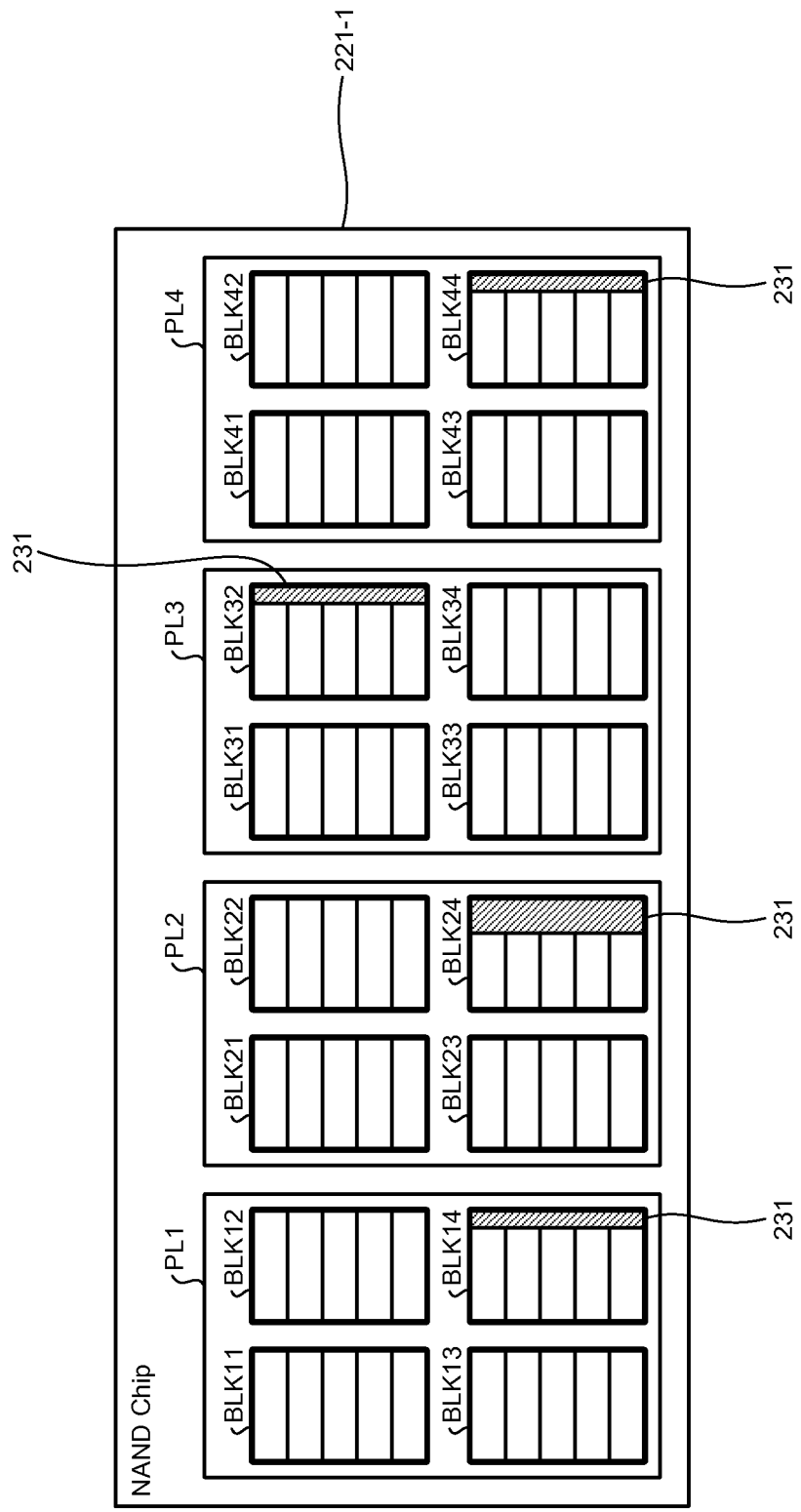
FIGS. 1A to 1C are views schematically illustrating one example of a procedure of a setting process of a multi-plane.
Figure 1B:
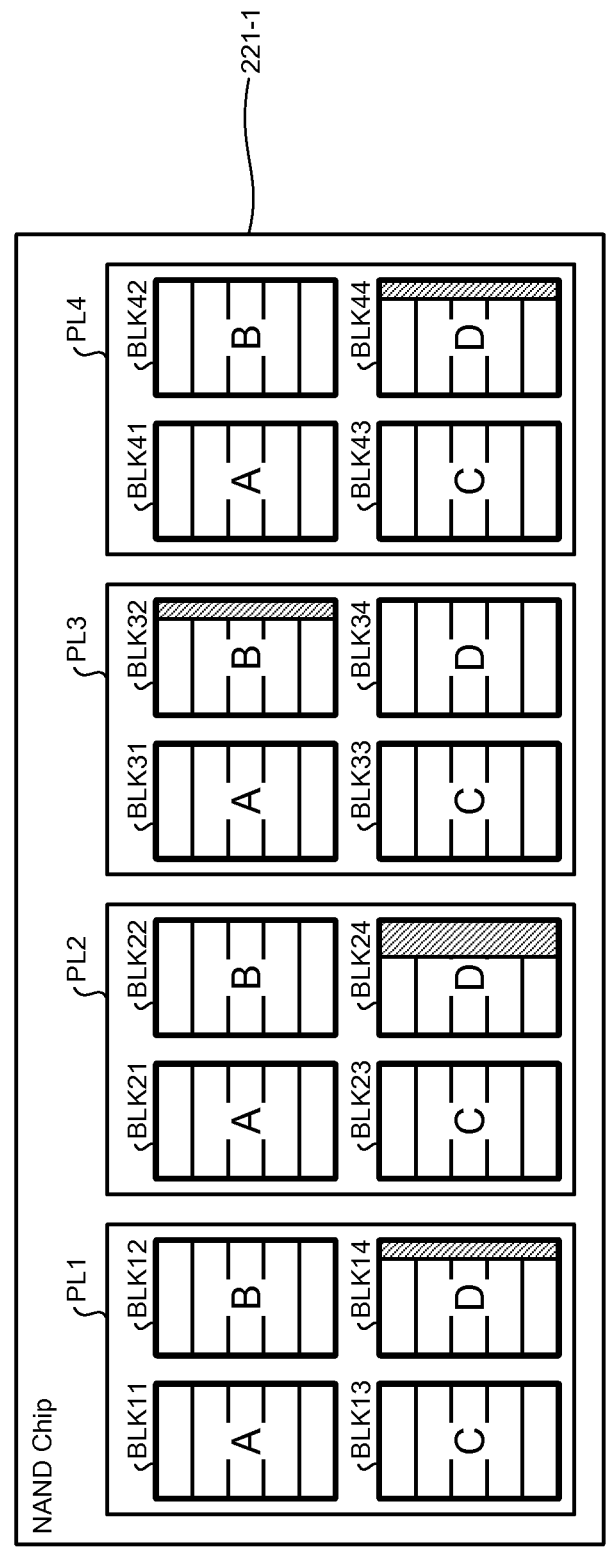
Figure 1C:
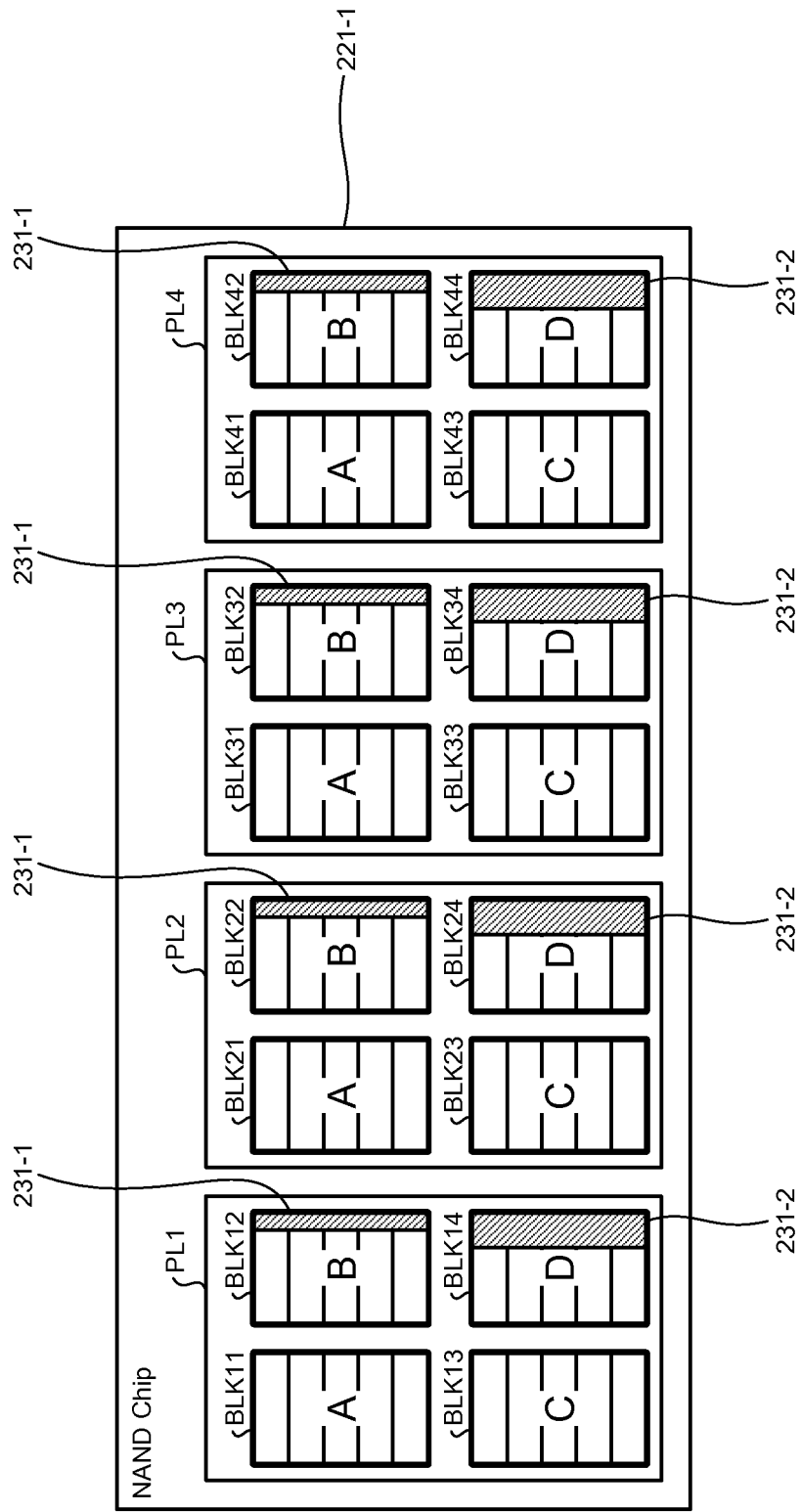

Some memory systems have a multi-plane structure. In the case of the multi-plane structure, the capacity, and the like of the blocks that form a set are synchronized as it is efficient to simultaneously carry out the recording/reproducing process on a plurality of blocks. FIGS. 1A to 1C are views schematically illustrating one example of a procedure of a setting process of the multi-plane. Generally, for example, the blocks existing at the corresponding positions in each of the planes are set as the multi-plane. As illustrated in FIG. 1A, in a memory chip 221-1, a block BLK11 of a plane PL1, a block BLK21 of a plane PL2, a block BLK31 of a plane PL3, and a block BLK41 of a plane PL4 are combined to configure a multi-plane A. Similarly, blocks BLK12, BLK22, BLK32, BLK42 of each of the planes PL1 to PL4 are combined to configure a multi-plane B; blocks BLK13, BLK23, BLK33, BLK43 of each of the planes PL1 to PL4 are combined to configure a multi-plane C; and blocks BLK14, BLK24, BLK34, BLK44 of each of the planes PL1 to PL4 are combined to configure a multi-plane D. The result is illustrated in FIG. 1B.

As illustrated in FIG. 1C, a length of the updated ECC storage region of another block is made the same in accordance with a block including a longest updated ECC storage region 231 in the respective multi-planes. As illustrated in FIG. 1B, the updated ECC storage region 231 exists in the block BLK14 of the plane PL1, the block BLK24 of the plane PL2, the block BLK32 of the plane PL3, and the block BLK44 of the plane PL4. Thus, the updated ECC storage region 231-1 is set in the multi-plane B, and the updated ECC storage region 231-2 is set in the multi-plane D.

In such method (FIG. 1C), the updated ECC storage regions 231-1, 231-2 are set in the two multi-planes B, D. That is, if the updated ECC storage region exists in at least one of the blocks forming the set, other blocks without any problems in quality that belong to the same set are also similarly synchronized for the size of the updated ECC storage region. As a result, the capacity of the memory system is wastefully reduced. In the illustrated example, the number of blocks in each plane is four, but in the actual product, one plane includes a few thousand or a few tens of thousands of blocks. Thus, although the wasteful capacity per one block is small, the region of a considerable amount of capacity that is non-negligible in the entire memory system becomes a waste in such method of configuring the multi-plane.

Hereinafter, embodiments in which the capacity does not become a waste in the memory system including the NAND memory having the multi-plane structure will be described.

First Embodiment

A first embodiment describes a case of carrying out an examination on the quality (performance) of a block configuring each plane at the time of production of the memory system, and combining the blocks configuring the multi-plane based on the result.

Figure 2:
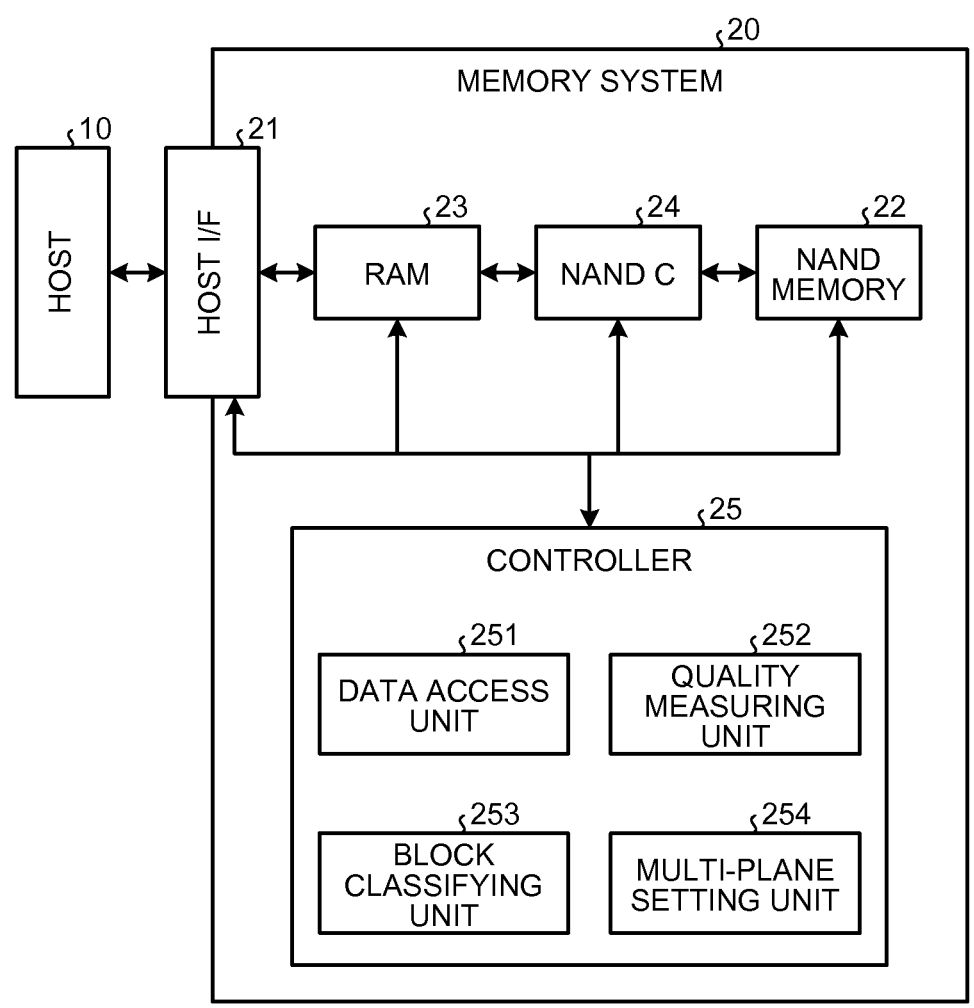
FIG. 2 is a block diagram schematically illustrating one example of a configuration of a memory system according to a first embodiment.

FIG. 2 is a block diagram schematically illustrating one example of a configuration of a memory system according to the first embodiment. A memory system 20 is, for example, an SSD (Solid State Drive) that uses the NAND type flash memory as a storage medium. The memory system 20 is connected to a host device (hereinafter referred to as host) 10 such as a personal computer or a CPU (Central Processing Unit) by way of a host interface (host I/F) 21 such as the ATA (Advanced Technology Attachment) interface, and the like, and functions as an external storage device of the host 10. The host 10 is, for example, a CPU of a personal computer, or a CPU or an imaging device such as a still camera, a video camera, and the like.

The memory system 20 includes the host interface 21, NAND type flash memory (hereinafter referred to as NAND memory) 22 serving as nonvolatile semiconductor memory, RAM (Random Access Memory) 23, which is semiconductor memory enabling high-speed access than the NAND memory 22, a NAND controller (NANDC) 24, and a controller 25.

The NAND memory 22 stores user data specified by the host 10 and backs up and stores management information managed in the RAM 23 as a nonvolatile management table. The management information is a piece of information that manages storage areas of the data in the NAND memory 22, for example. The NAND memory 22 includes a memory cell array in which a plurality of memory cells is arrayed in a matrix shape. The individual memory cell may be configured so that multi-value storage can be performed using an upper page and a lower page.

Figure 3:
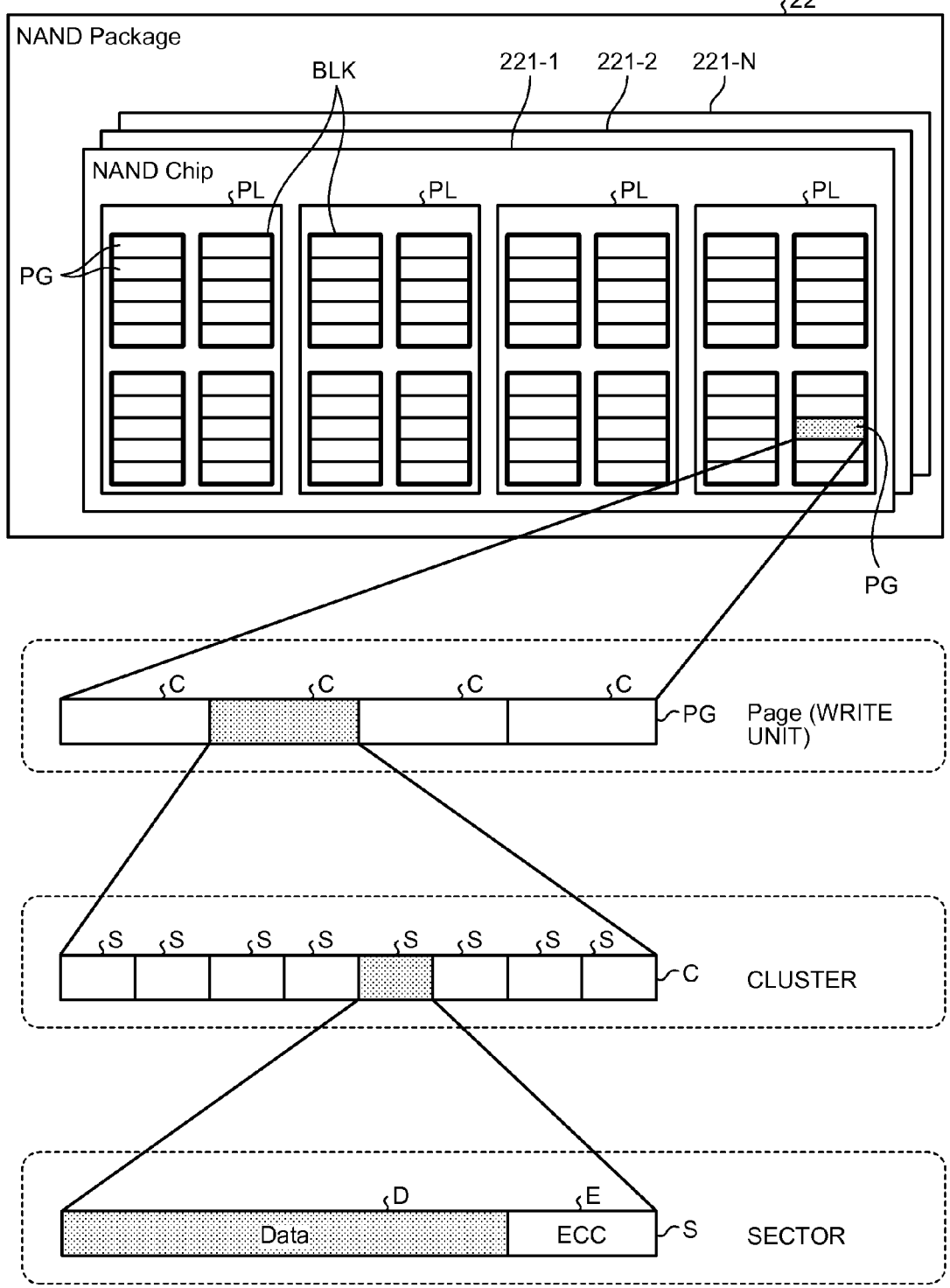
FIG. 3 is a view schematically illustrating one example of a configuration of NAND memory.

FIG. 3 is a view schematically illustrating one example of a configuration of the NAND memory. The NAND memory 22 has a package structure in which a plurality of memory chips 221-1 to 221-N (N is a natural number) are stacked. Each of the memory chips 221-1 to 221-N is configured by arraying a plurality of physical blocks BLK, each of which is a unit of data erase. Furthermore, in the NAND memory 22, the write of data and the readout of data are carried out for every physical page PG. The physical block BLK is configured by a plurality of physical pages PG.

Each physical page PG is configured by a plurality of clusters C, which is a management unit of an address in the NAND memory 22. Each cluster C is configured by a plurality of sectors S, which is a minimum access unit from the host 10. Each sector S includes a data storage region D that stores data, and an ECC storage region E that stores ECC. In an initial state, the size of the ECC storage region E is normally a predetermined value. However, even in the initial state, a block with degraded quality may exist or a block which quality degrades through use may exist in some blocks. In such a case, if the data cannot be protected when the size of the ECC storage region E is the predetermined value, the size of the ECC storage region E may be made to have a value greater than the predetermined value.

In the example of FIG. 3, each of the memory chips 221-1 to 221-N includes, for example 16 physical blocks BLK. Each of the memory chips 221-1 to 221-N has four planes PL including four physical blocks BLK. In other words, each of the memory chips 221-1 to 221-N is divided into four so that each district includes each plane PL. The respective planes PL includes a peripheral circuit (e.g., row decoder, column decoder, page buffer, data cache, etc.) independent from each other, and can simultaneously carry out erase/write/read by using a plane double speed mode. Each of the memory chips 221-1 to 221-N may be divided into a plurality of planes PL other than four planes. A plurality of blocks BLK other than four blocks may be arranged in each plane PL. Normally, one plane PL includes a few thousand, a few tens of thousands, or more blocks BLK.

The RAM 23 functions as a storage region serving as a write buffer for temporarily saving data when writing the data from the host 10 to the NAND memory 22, a storage region for storing and updating the management information such as the nonvolatile management table, a work region for temporarily storing data read out from the NAND memory 22, and the like.

The host 10 inputs an LBA (Logical Block Addressing) serving as a logical address to the memory system 20 through the host interface 21 when outputting a read request or a write request to the memory system 20. The LBA is a logical address in which a running number starting from zero is given to a sector (size: e.g., 512B).

The NANDC 24 includes a NAND I/F that carries out an interface process with the NAND memory 22, an error correction circuit, a DMA (Direct Memory Access) controller, and the like. The NANDC 24 writes the data temporarily stored in the RAM 23 to the NAND memory 22, and reads out the data stored in the NAND memory 22 and transfers the data to the RAM 23 based on control of the controller 25.

The function of the controller 25 is realized by a system program (firmware) stored in the NAND memory 22 and a processor that executes the firmware. The controller 25 includes a data access unit 251, a quality measuring unit 252, a block classifying unit 253, and a multi-plane setting unit 254. The configuring elements necessary in the present embodiment will be described herein.

The data access unit 251 executes the write process to the NAND memory 22 through a write buffer, the read process from the NAND memory 22, the data reduction (compaction) in the NAND memory 22, and the like. When accessing the NAND memory 22 in multi-plane, the block to access is selected based on the multi-plane setting information that specifies the block to be synchronized among the plurality of planes.

The quality measuring unit 252 measures the quality of each block of the NAND memory 22 or the performance associated with the quality. The quality of the block can be indicated by BER, access speed, number of rewrites (number or erases) of the block, and the like. In the present embodiment, the description will be made assuming the BER is used for the quality of the block by way of example.

The block classifying unit 253 classifies the blocks in each plane on the basis of the BER measured in the quality measuring unit 252. The classification includes sectionalizing at the range of the BER and classifying for every group, or ranking the blocks in the plane. A case of ranking the blocks in the plane will be described herein by way of example.

The multi-plane setting unit 254 combines the blocks of the same rank order from each plane to set the multi-plane. The combination associated with the block is stored in the NAND memory 22, for example, as the multi-plane setting information. If the block having the BER in which the ECC lacks at the size (hereinafter referred to as ECC length) of the standard ECC storage region exists in the multi-plane, the multi-plane setting unit 254 synchronizes the ECC length of all the blocks. Specifically, the multi-plane setting unit 254 changes the ECC length of the block of other planes in accordance with the block having the longest ECC length in the multi-planes. The ECC length of each multi-plane is stored in the multi-plane setting information.

The processes by the quality measuring unit 252, the block classifying unit 253, and the multi-plane setting unit 254 are carried out when the memory system 20 is manufactured in the factory, for example, during the quality test.

Figure 4:
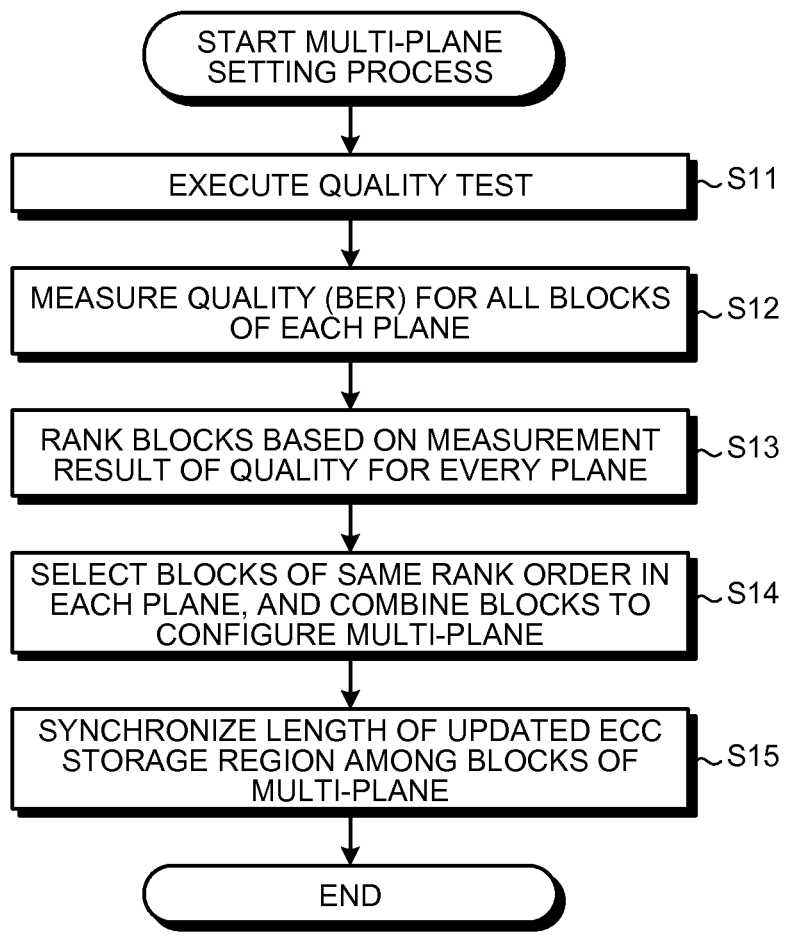
FIG. 4 is a flowchart illustrating one example of a procedure of a multi-plane setting process according to the first embodiment.

A process of setting the multi-plane at the time of production will now be described. FIG. 4 is a flowchart illustrating one example of a procedure of the multi-plane setting process according to the first embodiment, and FIGS. 5A to 5D are views schematically illustrating one example of a procedure of the multi-plane setting process according to the first embodiment. In the example of FIGS. 5A to 5D, a case in which one memory chip includes four planes PL1 to PL4, and each plane PL1 to PL4 includes four blocks will be described by way of example.

First, when the quality test of the memory system 20 is carried out in the factory (step S11), the quality measuring unit 252 of the controller 25 measures the quality (BER) for all the blocks configuring the plane of each memory chip (step S12). As a result, the ECC lacks in the standard ECC storage region, and blocks BLK14, BLK24, BLK32, BLK44 requiring the updated ECC storage region 231 including the newly assigned ECC storage region exist, as illustrated in FIG. 5A. This is because the BER of each block varies at the time of production. The width of the updated ECC storage region 231 in the figure visually indicates the proportion of the ECC storage region in the physical page and does not indicate the position of the actual updated ECC storage region 231.

Figure 5B:
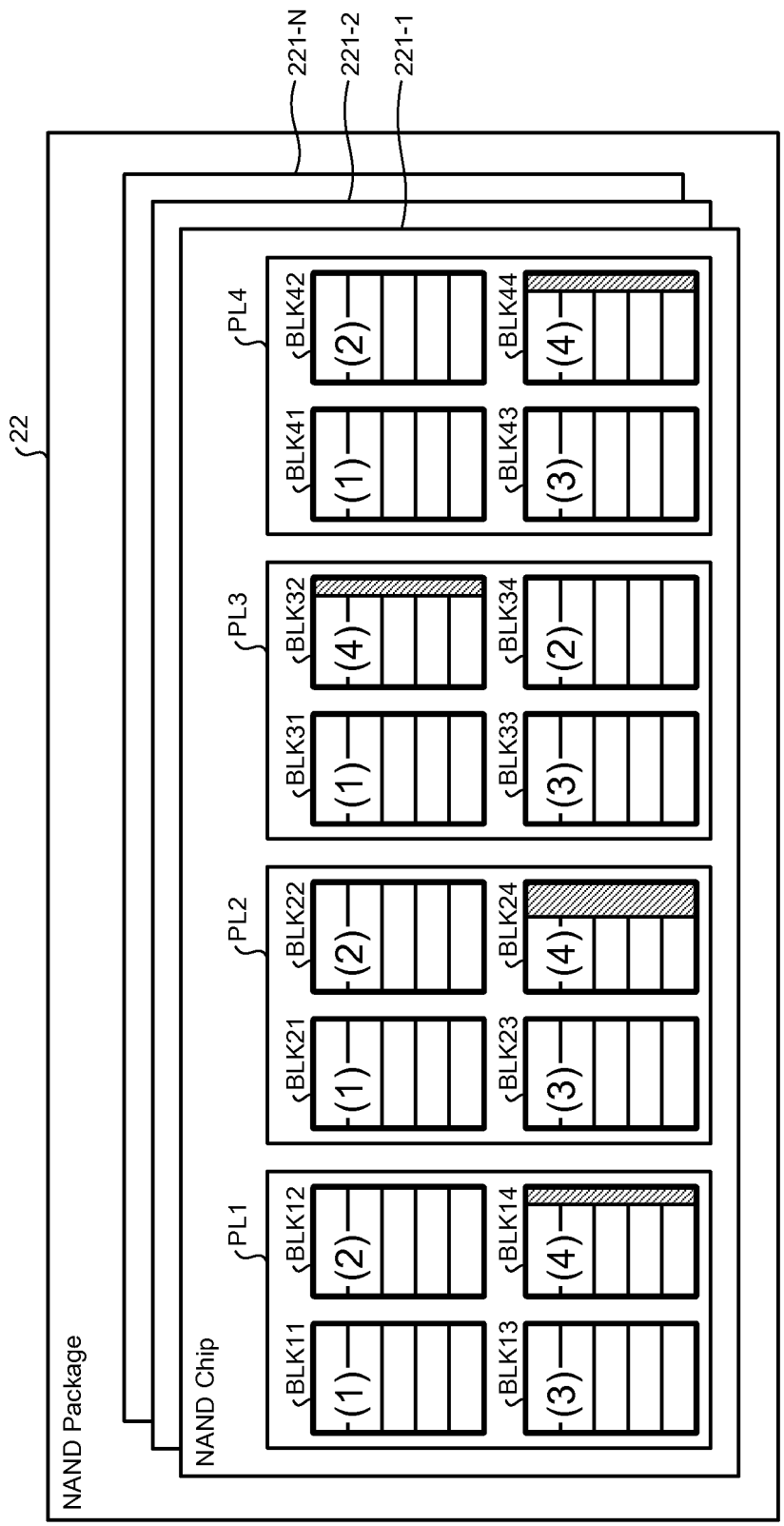

The block classifying unit 253 ranks the blocks for every plane based on the measurement result of the quality (step S13). For example, the blocks are ranked in the order of good quality (order of low BER). In FIG. 5B, the rank order of the blocks in each plane PL1 to PL4 is illustrated with a number in parentheses.

The block classifying unit 253 thereafter selects one block from each plane PL1 to PL4 in the order of satisfactory ranking, that is, in the order of good recording quality to configure the multi-plane (step S14). For example, in FIG. 5B, the block BLK1 in which the rank order in the plane PL1 is the first, the block BLK21 in which the rank order in the plane PL2 is the first, the block BLK31 in which the rank order in the plane PL3 is the first, and the block BLK41 in which the rank order in the plane PL4 is the first are selected and combined to obtain a multi-plane A. Similarly, the blocks BLK12, BLK22, BLK34, BLK42, in which the rank order is the second in the respective planes PL1 to PL4, are combined to configure a multi-plane B; the blocks BLK13, BLK23, BLK33, BLK43, in which the rank order is the third in the respective planes PL1 to PL4, are combined to configure a multi-plane C; and the blocks BLK14, BLK24, BLK32, BLK44, in which the rank order is the fourth in the respective planes PL1 to PL4, are combined to configure a multi-plane D. The result is illustrated in FIG. 5C. The blocks including the updated ECC storage region 231 are combined to set the multi-plane, and the blocks not including the updated ECC storage region 231 are combined to set the multi-plane. The combination of blocks configuring the multi-planes A to D is stored as the multi-plane setting information.

Next, the updated ECC storage region is synchronized among the blocks of the set multi-plane (step S15). This is performed so that if there exists a block having the quality (BER) in which the ECC length lacks at the length set in advance, the ECC length of the block of other planes is changed in accordance with the block having the longest ECC length. The synchronization result is illustrated in FIG. 5D. In FIG. 5C, the updated ECC storage region 231 is set in each block BLK14, BLK24, BLK32, BLK44 of the multi-plane D. The ECC length of the updated ECC storage region 231 of the block BLK24 of the plane PL2 is the longest. Thus, the ECC length of the updated ECC storage region 231 of the other blocks BLK14, BLK32, BLK44 of the multi-plane D is conformed to the longest length of the updated ECC storage region 231 of the block BLK24. The length of the updated ECC storage region 231 is also stored in the multi-plane setting information. The setting process of the multi-plane is thereby terminated.

The updated ECC storage region is used for the purpose of strengthening the protection of data in a block with poor BER. Thus, when the updated ECC storage region is executed in the plane and if the amount is large, this means that the BER is high and the rank order is lower in the plane. In other words, in the multi-plane of high rank order, the blocks in which the ECC length of the updated ECC storage region is short or the blocks in which the updated ECC storage region is not executed are gathered from each plane, so that the influence of capacity reduction by the synchronization process of the updated ECC storage region becomes small in the multi-plane in which the blocks of high rank order are combined. In the example of FIG. 5C, one of each of the blocks BLK14, BLK24, BLK32, BLK44 in which the updated ECC storage region 231 is executed, exists in each plane PL1 to PL4, and such blocks are all gathered in the multi-plane D of the lowest rank order. The synchronization process of the updated ECC storage region 231 by multi-plane correspondence is carried out only in the multi-plane D, and the capacity reduction by the synchronization of the updated ECC storage region does not occur in the remaining multi-planes A, B, C (FIG. 5D).

In the first embodiment, the quality is measured at the time of production of the memory system 20 having the multi-plane structure, the blocks are ranked in each plane based on the quality, and one block of the same rank order is selected from each plane and combined to set the multi-plane. If the block including the updated ECC storage region exists in each multi-plane, the length of the updated ECC storage of other blocks in the same multi-plane is conformed to the block having the longest updated ECC storage region. Thus, compared to when none of the processes is carried out as illustrated in FIG. 1A to FIG. 1C with respect to the updated ECC storage region, it is possible to alleviate the wasteful capacity reduction due to the synchronization of the updated ECC storage region.

The quality is measured at the time of production to set the multi-plane, whereby the capacity of the memory system 20 can be easily ensured and the yield can be enhanced.

Second Embodiment

In the first embodiment, the multi-plane is set based on the result of the quality measured at the time of the production.

However, the memory cell generally wears out and the quality degrades if the memory system is continuously used. Thus, in the second embodiment, a case of reconfiguring the combination of the blocks configuring the multi-plane during the use of the memory system will be described.

Figure 6:
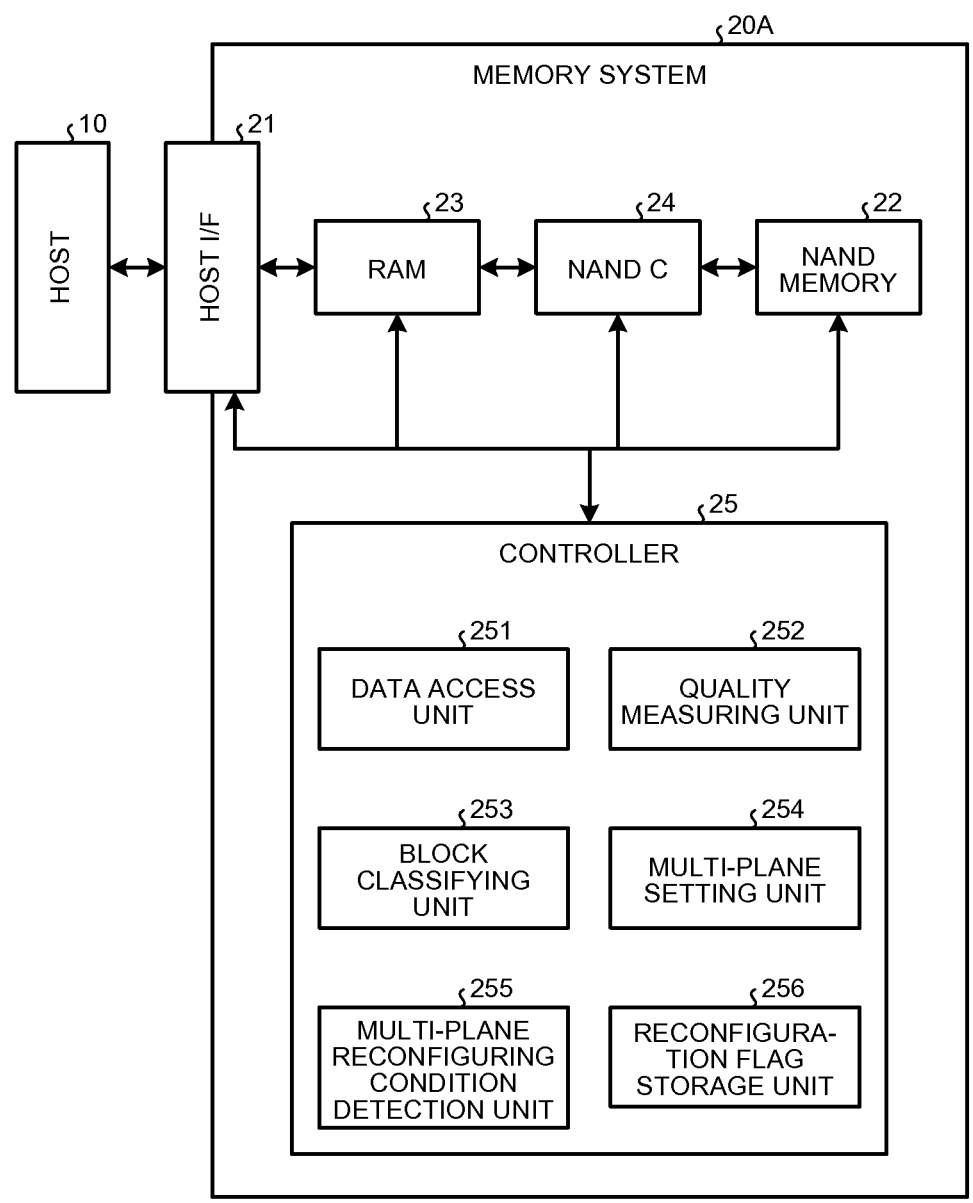
FIG. 6 is a block diagram schematically illustrating one example of a configuration of a memory system according to a second embodiment.

FIG. 6 is a block diagram schematically illustrating one example of a configuration of a memory system according to a second embodiment. A memory system 20A further includes a multi-plane reconfiguring condition detection unit 255 and a reconfiguration flag storage unit 256 in a controller 25 of the memory system 20 of the first embodiment. In this embodiment as well, a case of using the BER for the quality will be described by way of example.

The multi-plane reconfiguring condition detection unit 255 detects the condition to become a trigger in reconfiguring the combination of the blocks configuring the multi-plane. The condition to become the trigger includes, for example, time, recording quality, command, status, execution of updated ECC storage region with respect to block, warning by SMART (Self-Monitoring & Analysis Reporting Technology), and the like. The multi-plane reconfiguring condition detection unit 255 turns ON the flag of the reconfiguration flag storage unit 256 when detecting the condition to become the trigger.

In the determination using the time, for example, the timing is started from the operation of the memory system 20A and whether a predetermined period (one month, one year, etc.) has elapsed is determined. If a predetermined period has elapsed, the multi-plane reconfiguring condition detection unit 255 turns ON the flag of the reconfiguration flag storage unit 256. When the flag of the reconfiguration flag storage unit 256 is turned ON, the quality measuring unit 252, the block classifying unit 253, and the multi-plane setting unit 254 carry out the reconfiguration of the multi-plane. After the multi-plane reconfiguring process, the timing is reset, so that the performance of the multi-plane reconfiguring process after elapse of a predetermined period is periodically repeated. The reconfiguration of the multi-plane is the process of reviewing the combination of blocks of each of the planes configuring the multi-plane.

In the determination using the recording quality, for example, whether an error indicating lowering in the recording quality such as a read error is issued during the read process by a data access unit 251 is determined. If the error indicating the lowering in the recording quality is detected, the multi-plate reconfiguring condition detection unit 255 turns ON the flag of the reconfiguration flag storage unit 256.

In the determination using the command, for example, a command instructing the multi-plane reconfiguration is prepared in advance, and whether the command instructing the multi-plane reconfiguration is executed by the user is determined. If the command instructing the multi-plane reconfiguration is detected, the multi-plane reconfiguring condition detection unit 255 turns ON the flag of the reconfiguration flag storage unit 256.

In the determination using the status, for example, when a status indicating read error or read success is transmitted from NAND memory 22 to the controller 25 after the read command is issued, whether the status of the read error is detected is determined. If the read error is detected, the multi-plane reconfiguring condition detection unit 255 turns ON the flag of the reconfiguration flag storage unit 256.

In the determination using the execution of the updated ECC storage region with respect to the block, determination is made at the timing the updated ECC storage region is set with respect to the block. If the setting of the updated ECC storage region is detected, the multi-plane reconfiguring condition detection unit 255 turns ON the flag of the reconfiguration flag storage unit 256.

In the determination using the warning by the SMART, the memory system 20A carries out a self-diagnosis, and makes the determination using the warning issued when a parameter associated with quality such as the temperature, the number of writes, and the like of the current memory system 20A (NAND memory 22) exceeds the threshold value, as a result. If the warning by the SMART is issued, the multi-plane reconfiguring condition detection unit 255 turns ON the flag of the reconfiguration flag storage unit 256.

The flag of the reconfiguration flag storage unit 256 is turned ON by the multi-plane reconfiguring condition detection unit 255 when the condition to become the trigger is satisfied. When the reconfiguration flag is turned ON, the quality measuring unit 252, the block classifying unit 253, and the multi-plane setting unit 254 carry out the reconfiguring process of the multi-plane. After the reconfiguration of the multi-plane is finished, the reconfiguration flag is turned OFF by the multi-plane setting unit 254. The same reference numerals are denoted on the configuring elements same as the first embodiment, and the description thereof will be omitted.

Figure 7:
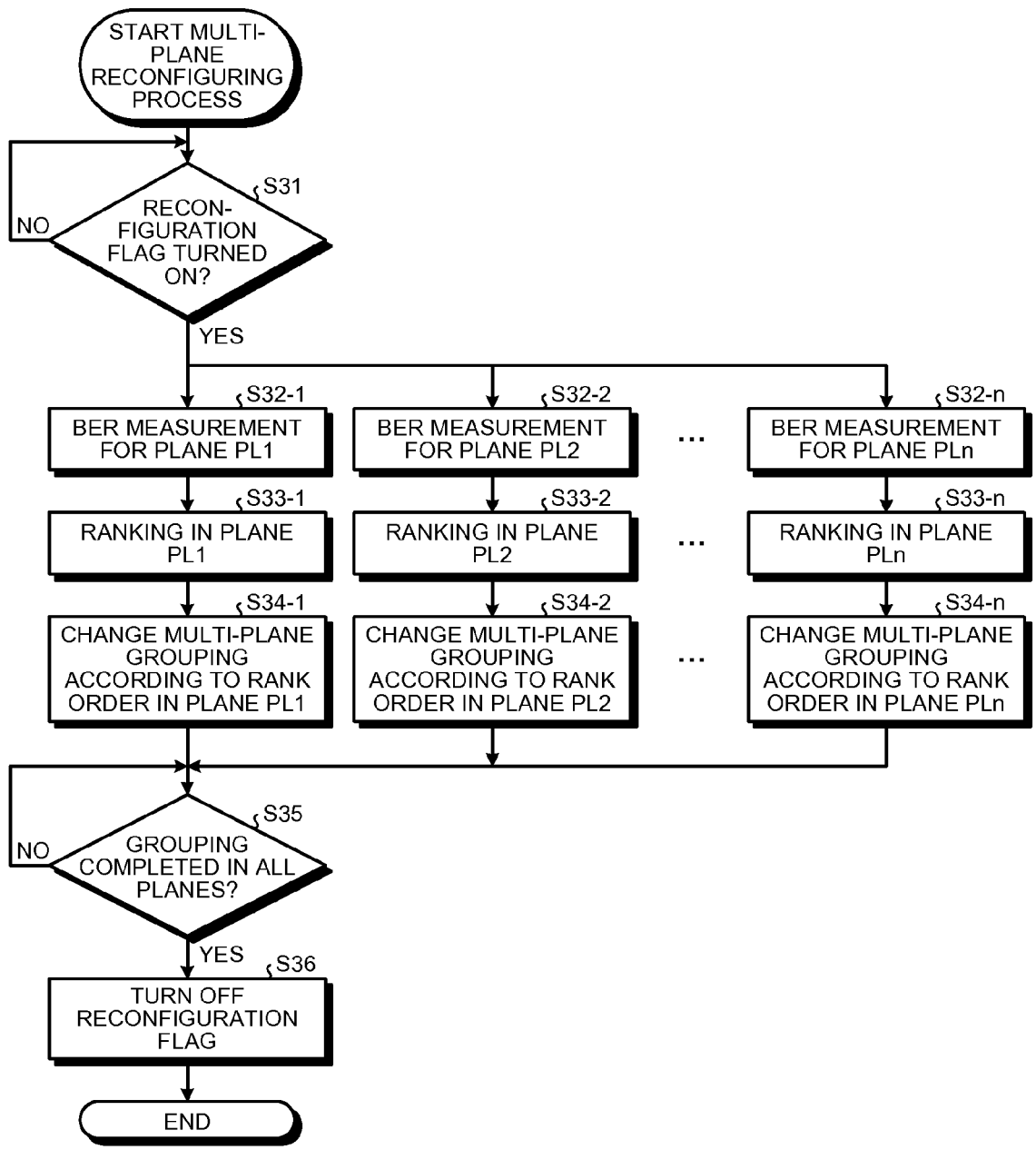
FIG. 7 is a flowchart illustrating one example of a procedure of a multi-plane reconfiguring process according to the second embodiment.

Next, the process of resetting the multi-plane by the degradation of quality involved in the use of the memory system 20A will be described. FIG. 7 is a flowchart illustrating one example of a procedure of the multi-plane reconfiguring process according to the second embodiment.

Assume that the memory system 20A is in a state of being used by the user, and the multi-plane reconfiguring condition detection unit 255 is in a state of monitoring whether the condition to become the trigger for reconfiguring the multi-plane is satisfied. The multi-plane reconfiguring condition detection unit 255 turns ON the reconfiguration flag of the reconfiguration flag storage unit 256 if the condition to become the trigger is satisfied, and holds the reconfiguration flag of the reconfiguration flag storage unit 256 turned OFF if the condition to become the trigger is not satisfied.

The quality measuring unit 252 determines whether the reconfiguration flag of the reconfiguration flag storage unit 256 is turned ON (step S31). If the reconfiguration flag is turned OFF (No in step S31), the multi-plane reconfiguration may not be carried out and a waiting state may be continued until the reconfiguration flag is turned ON.

If the reconfiguration flag is turned ON (Yes in step S31), the quality measuring unit 252 carries out the BER measurement for each plane (steps S32-1, S32-2, . . . , S32-$n$ ($n$ is a natural number, and is the number of planes)).

Next, the block classifying unit 253 performs ranking based on the measurement result of the BER in each plane (steps S33-1 to S33-$n$). Thereafter, the multi-plane setting unit 254 changes the grouping of the multi-planes in each plane based on the ranking (steps S34-1 to S34-$n$). In this case, the block of the own plane configuring the multi-plane of a certain rank order is changed based on the ranking, and the synchronization process of the ECC storage region at the relevant time point is also carried out. The multi-plane setting information is updated with such content.

Subsequently, whether or not the grouping is completed in all the planes is determined (step S35). The processes of the steps S32-$x$ to S34-$x$ ($x$ is a natural number between 1 and $n$) in each plane are not simultaneously executed. Thus, whether the grouping process is finished in all the planes can be determined by, for example, recording the plane in which the grouping is completed.

If the grouping is not completed in all the planes (No in step S35), the waiting state is continued until the grouping is completed in all the planes. If the grouping is completed in all the planes (Yes in step S35), on the other hand, the multi-plane setting unit 254 turns OFF the reconfiguration flag of the reconfiguration flag storage unit 256 (step S36), and terminates the reconfiguring process.

Figure 8:
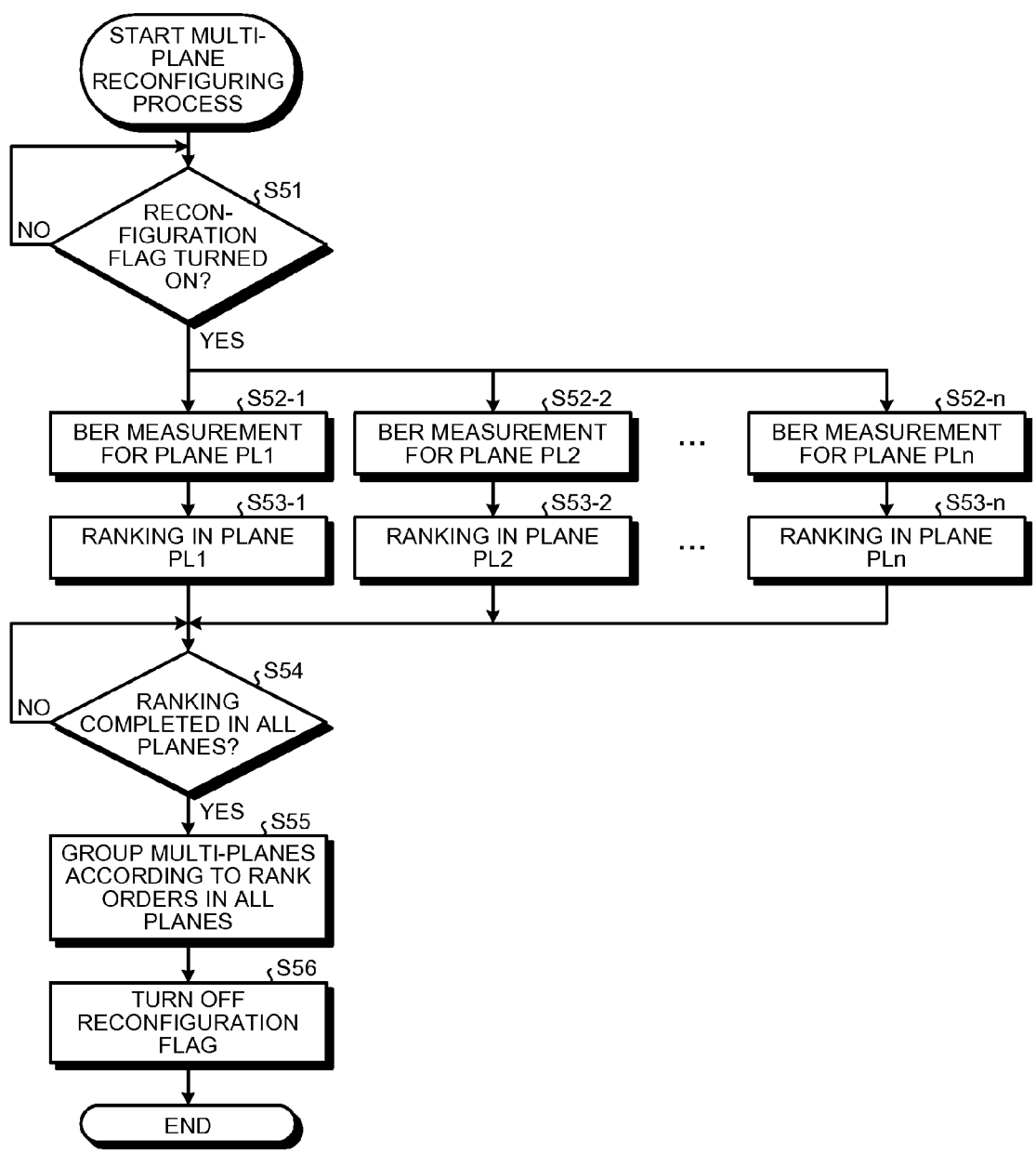
FIG. 8 is a flowchart illustrating another example of the procedure of the multi-plane reconfiguring process according to the second embodiment.

Therefore, a case of performing the grouping of the multi-planes for every plane has been described, but the grouping of the multi-planes may be performed at once after the ranking of all the planes is completed. FIG. 8 is a flowchart illustrating another example of the procedure of the multi-plane reconfiguring process according to the second embodiment.

Similar to the steps S31 to S33-$n$ of FIG. 7, when the reconfiguration flag is turned ON, the quality measuring unit 252 carries out the BER measurement for each plane, and the block classifying unit 253 carries out ranking in each plane based on the measurement result of the BER (steps S51 to S53-$n$).

Thereafter, the multi-plane setting unit 254 determines whether or not the ranking is completed in all the planes (step S54). If the ranking is not completed in all the planes (No in step S54), the waiting state is continued until the ranking is completed in all the planes. If the ranking is completed in all the planes (Yes in step S54), on the other hand, the multi-plane setting unit 254 carries out the grouping of the multi-planes based on the rank order in all the planes (step S55). The grouping is a process of assuming the blocks of the same rank order in each plane as one multi-plane, as described in the first embodiment. Furthermore, the synchronization process of making the ECC length the same as the block having the longest ECC length in one multi-plane is also carried out. The multi-plane setting information for a new multi-plane is thereby stored.

Thereafter, the multi-plane setting unit 254 turns OFF the reconfiguration flag of the reconfiguration flag storage unit 256 (step S56), and terminates the reconfiguring process.

In this method, the grouping process of the multi-planes is carried out only once, and hence the burden on the controller 25 can be alleviated. In the method of FIG. 7, the grouping of the multi-planes can be changed in order from the plane in which the ranking is completed without waiting for all the ranking to be completed. In other words, the waiting time until all the ranking is completed can be reduced. The measurement of the quality and the ranking in each plane in FIG. 7 and FIG. 8 are desirably processed in the background so as not to influence the normal operation in the memory system 20A.

In the second embodiment, after the memory system 20A is used by the user, the quality is measured at a predetermined timing, and the multi-planes are grouped based on the result. Thus, even if the quality is deteriorated with the use of the memory system 20A, the blocks in which the quality deteriorated can be re-combined as the multi-plane. As a result, the capacity reduction by the synchronization of the updated ECC storage region during the use of the memory system is alleviated, and the lifespan of the memory system can be extended.

Third Embodiment

In the first and second embodiments, the configuration or reconfiguration of the multi-planes is carried out based on the ranking carried out with respect to the blocks in each plane. In the third embodiment, a case of classifying the blocks into a plurality of groups rather than ranking the blocks in each plane in the configuration or the reconfiguration of the multi-plane will be described by way of example.

The configuration of the memory system according to the third embodiment is similar to the configuration described in the first embodiment or the second embodiment, but differs in the processes of the block classifying unit 253 and the multi-plane setting unit 254. The block classifying unit 253 classifies the block in each plane to a plurality of groups based on the quality measured by the quality measuring unit 252. The plurality of groups is defined by quality. The plurality of groups is ranked according to the defined quality.

Figure 9:
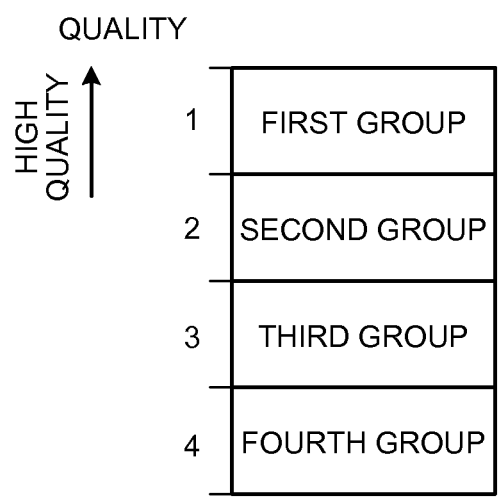
FIG. 9 is a view schematically illustrating a group according to a third embodiment.

FIG. 9 is a view schematically illustrating a group according to the third embodiment. In the example illustrated in the figure, the group is classified into four. The quality is represented in four stages, for example, where the quality is higher the greater the numerical value. The first group is a group in which the quality belongs to 1, the second group is a group in which the quality belongs to 2, the third group is a group in which the quality belongs to 3, and the fourth group is a group in which the quality belongs to 4. In the groups classified in such manner, the quality degrades from the first group toward the fourth group. Thus, rank orders are given to the groups. FIG. 9 merely illustrates one example, and the quality can be more finely classified, and the quality to be classified to each group can be arbitrarily set.

Figures 11, 12:
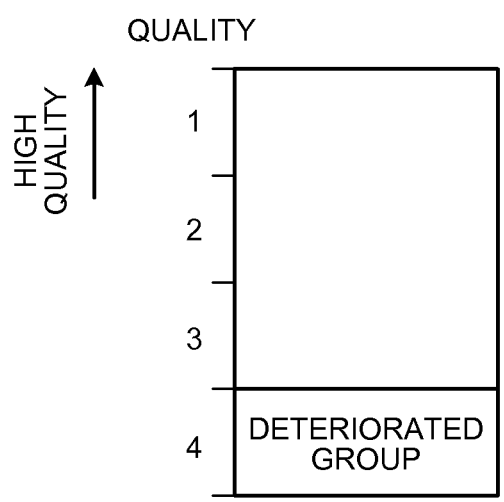
FIG. 11 is a view illustrating one example of multi-plane setting information according to the third embodiment.
FIG. 12 is a view schematically illustrating a group according to a fourth embodiment.

The multi-plane setting unit 254 basically sets the multi-plane by combining the blocks selected from the same group in each plane, and synchronizes the ECC length if the updated ECC storage region is set. FIG. 10 is a view illustrating one example of the classification of blocks for every plane according to the third embodiment, and FIG. 11 is a view illustrating one example of the multi-plane setting information according to the third embodiment. Using a table classified from the first group to the fourth group in each plane illustrated in FIG. 10, one block in the same group is selected from each plane. As illustrated in FIG. 11, the selected blocks are grouped as the multi-plane. The variation in the quality among the blocks in the same group is within a predetermined range, and the wasteful reduction in the capacity of the data region can be suppressed even if the ECC length is made the same as the block of the longest ECC length when the updated ECC storage region is set.

The configuring process or the reconfiguring process of the multi-plane in this case is similar to the process described in the first or second embodiment. In the first or second embodiment, however, one blocks of the same rank order in each plane are combined to configure the multi-plane, whereas in the third embodiment, the block selected from the group of the same rank order in each plane are combined to configure the multi-plane.

In the third embodiment, each of the blocks is grouped based on the quality measured by the quality measuring unit 252, and the one block selected from the group in the same rank order in each plane are combined to configure the multi-plane. Thus, all the blocks do not need to be ranked in each plane as in the first and second embodiments, whereby an effect in that the process by the block classifying unit 253 can be reduced compared to the first and second embodiments can be obtained in addition to the effects of the first and second embodiments.

Fourth Embodiment

In the third embodiment, a case of classifying the blocks in each plane into a plurality of groups has been described by way of example, but in the fourth embodiment, a case of grouping only the blocks in which the quality is lower than or equal to a predetermined value of the blocks in each plane will be described by way of example.

The configuration of the memory system according to the fourth embodiment is similar to the configuration described in the first embodiment or the second embodiment, but differs in the processes of a block classifying unit 253 and a multi-plane setting unit 254. The block classifying unit 253 classifies the block, in which the quality of the block measured by a quality measuring unit 252 is lower than or equal to a predetermined value, as a deteriorated group. That is, the fourth embodiment can be assumed as a case of classifying the blocks in one plane into two groups of the deteriorated group and the other groups.

FIG. 12 is a view schematically illustrating the group according to the fourth embodiment. As illustrated in the figure, the block in which the quality (e.g., BER) of each block is lower than or equal to a predetermined value is classified as the deteriorated group. In FIG. 9, the block in which the quality is 4 is classified as the deteriorated group.

The multi-plane setting unit 254 basically combines the block selected from the same group in each plane to set the multi-plane and synchronizes the ECC length, similar to the description made in the third embodiment. That is, when selecting a block from the deteriorated group in a certain plane, a block is also selected from the deteriorated group in other planes to configure the multi-plane. When selecting a block from other than the deteriorated group in a certain plane, a block is also selected from other than the deteriorated group in other planes to configure the multi-plane.

Thus, the blocks with deteriorated quality can be combined to configure the multi-plane, whereby the capacity of the data region that becomes a waste can be reduced compared to the multi-plane in which the block with deteriorated quality and the block with normal quality coexist.

The configuring process or the reconfiguring process of the multi-plane in this case is similar to that described in the first or second embodiment. As described above, the blocks of the same rank in each plane are combined to configure the multi-plane in the first or second embodiment, whereas in the fourth embodiment, if a block is selected from the deteriorated group in a certain plane, a block is also selected from the deteriorated group in other planes and if a block is selected from other than the deteriorated group in a certain plane, a block is also selected from other than the deteriorated group in other planes in the multi-plane configuration.

The fourth embodiment has effects similar to the third embodiment.

Fifth Embodiment

In the first and second embodiments, a case of using the BER for the quality has been described, but this is not the sole case. For example, the readout speed or the write speed may be used for the quality. With respect to the readout speed or the write speed, the readout or the write takes time if the quality of the NAND memory is deteriorated. Thus, the readout speed (readout time) or the write speed (write time) can be used as an index that indicates quality.

The number of rewrites (number of erases) of each block may be used for the quality. The number of rewrites is managed for every block configuring NAND memory 22, where the block is selected from each plane and combined to configure the multi-plane, as described in the first to fourth embodiments, with the number of rewrites as a reference.

Generally, the quality (performance) tends to deteriorate the greater the number of rewrites in the NAND memory 22. Thus, the degree of deterioration of the quality of the NAND memory 22 can be estimated from the number of rewrites by researching in advance the number of rewrites—quality relational information indicating the relationship of the number of rewrites and the degree of deterioration in the quality of the NAND memory 22. The number of rewrites is managed in the management information for every block, as described above, and thus the quality for every block can be known by using the number of rewrites for every block in the management information and the number of rewrites—quality relational information. The configuration or the reconfiguration of the multi-plane can be carried out through the methods described in the first to fourth embodiments.

Furthermore, the parameter (BER, readout speed, write speed, etc.) indicating the quality and the number of rewrites of the NAND memory 22 may be combined to perform the ranking of the groups for classifying each block. FIG. 13 is a view illustrating one example of the ranking of the groups by the fifth embodiment. As illustrated in the figure, the horizontal axis indicates quality (e.g., BER) and the vertical axis indicates number of rewrites. The quality is classified to four stages, and the number of rewrites is also classified to four stages. The combination of the quality and the number of rewrites is classified into four groups as illustrated in the figure. Thus, even if the quality is a high quality of 1, for example, the rank order is the second rank order if the number of rewrites is $10^4$ to $10^5$ times, and the rank order is the third rank order if the number of rewrites is $10^5$ or more. Thus, the ranking corresponding to the actual usage situation can be carried out by combining the quality and the number of rewrites.

The fifth embodiment also has effects similar to the first to fourth embodiments.

In the embodiments described above, the NAND memory 22 is configured by a plurality of multi-planes classified according to the quality. If the BER is used for the quality, low BER means fast access speed (readout speed and write speed). Thus, a data access unit 251 of a controller 25 may write the frequently accessed data to the multi-plane of low BER. Alternatively, the data access unit 251 may prevent the frequently accessed data from being written to the multi-plane having a quality of lower than or equal to at least a predetermined value. Thus, the access time of the frequently accessed data can be prevented from being carelessly long.

In the description made above, the plane and the multi-plane have been described. However, the plane merely needs to be, at the very least, one of the plurality of groups that can be accessed simultaneously and in parallel in the NAND memory 22. The multi-plane merely needs to be a collection of access units selected one from each of the plurality of groups.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of planes, each of the planes including a plurality of blocks; and
   a controller configured to simultaneously access blocks configuring a multi-plane, the multi-plane being a set of one block selected from each of the plurality of planes;
   wherein the controller includes, a quality measuring unit configured to measure a quality of the block,
   a block classifying unit configured to classify the blocks for every plane based on a measurement result of the quality, and
   a multi-plane setting unit configured to select one block belonging to the same classification from each plane and combines the blocks to generate a multi-plane.

2. The memory system according to claim 1, wherein the multi-plane setting unit synchronizes a size of an error correction code among the blocks in the multi-plane.

3. The memory system according to claim 1, wherein
   the block classifying unit ranks the blocks in each plane based on the measurement result; and
   the multi-plane setting unit selects the blocks having the same rank order from each plane to generate the multi-plane.

4. The memory system according to claim 1, wherein
   the block classifying unit classifies the blocks in each plane into a plurality of groups based on the measurement result; and
   the multi-plane setting unit selects one block belonging to the same group from each plane to generate the multi-plane.

5. The memory system according to claim 4, wherein the group is ranked by the quality.

6. The memory system according to claim 1, wherein the quality is BER, access speed, or number of rewrites of the block.

7. The memory system according to claim 5, wherein the ranking of the group by the quality is carried out based on a combination of the BER and the number of rewrites of the block, or on a combination of the access speed and the number of rewrites of the block.

8. The memory system according to claim 1, wherein a setting process of the multi-plane by the quality measuring unit, the block classifying unit, and the multi-plane setting unit is executed in manufacturing of the memory system.

9. The memory system according to claim 1, wherein
   the controller further includes a reconfiguring condition detection unit configured to detect a condition performing reconfiguration of the multi-plane; and
   the quality measuring unit, the block classifying unit, and the multi-plane setting unit execute a configuring process of the multi-plane, when the condition performing the reconfiguration of the multi-plane is detected by the reconfiguring condition detection unit.

10. The memory system according to claim 9, wherein the reconfiguring condition detection unit detects, as the condition performing the reconfiguration of the multi-plane, elapse of a predetermined time, lowering in a recording quality of the nonvolatile memory, command instructing the reconfiguration of the multi-plane, status indicating an access error transmitted after an access command is issued, execution of assignment of a new ECC storage region with respect to the block, or warning by self-diagnosis.

11. A memory system comprising: a nonvolatile memory including a plurality of planes, each of the planes including a plurality of; and a controller configured to simultaneously access blocks that are included in a multi-plane, the multi-plane being a set of one block selected from each of at least two or more planes based on a quality of the plurality of blocks that are included in each of the plurality of planes.

12. A method of controlling a memory system including,
   a nonvolatile memory including a plurality of planes, each of the planes including a plurality of blocks; and
   a controller configured to simultaneously access blocks configuring a multi-plane, the multi-plane being a set of one block selected from each of the plurality of planes;
   the control method comprising:
   measuring a quality of the block,
   classifying the blocks for every plane based on a measurement result of the quality, selecting one block belonging to the same classification from each plane, and combining the selected blocks to generate a multi-plane.

13. The method of controlling the memory system according to claim 12, further comprising:
   synchronizing a size of an error correction code among the blocks in the multi-plane after the generation of the multi-plane.

14. The method of controlling the memory system according to claim 12, wherein
   in the classification of the blocks, the blocks are ranked in each plane based on the measurement result; and
   in the generation of the multi-plane, the blocks having the same rank order are selected from each plane to generate the multi-plane.

15. The method of controlling the memory system according to claim 12, wherein
   in the classification of the blocks, the blocks in each plane are classified into a plurality of groups based on the measurement result; and
   in the generation of the multi-plane, one block belonging to the same group is selected from each plane to generate the multi-plane.

16. The method of controlling the memory system according to claim 15, wherein the group is ranked by the quality.

17. The method of controlling the memory system according to claim 12, wherein the quality is BER, access speed, or number of rewrites of the block.

18. The method of controlling the memory system according to claim 12, wherein the measurement of the quality, the classification of the block, and the generation of the multi-plane are executed in manufacturing of the memory system.

19. The method of controlling the memory system according to claim 12, further comprising:
   detecting a condition performing reconfiguration of the multi-plane; wherein
   the measurement of the quality, the classification of the block, and the generation of the multi-plane are executed, when detected that the condition is satisfied, and
   in the generation of the multi-plane, grouping of the blocks of the corresponding plane in the multi-plane is changed in order from the plane in which the classification of the block in the plane is completed.

20. The method of controlling the memory system according to claim 12, further comprising:
   detecting a condition performing reconfiguration of the multi-plane; wherein
   the measurement of the quality, and the classification of the block are executed, when detected that the condition is satisfied, and
   the generation of the multi-plane is executed when the classification of the blocks is completed in all the planes in the classification of the blocks.

* * * * *